(12) United States Patent
Lin

(10) Patent No.: US 10,886,901 B1
(45) Date of Patent: Jan. 5, 2021

(54) LOW SUPPLY VOLTAGE RING OSCILLATOR AND METHOD THEREOF

(71) Applicant: Realtek Semiconductor Corp., Hsinchu (TW)

(72) Inventor: Chia-Liang (Leon) Lin, Fremont, CA (US)

(73) Assignee: REALTEK SEMICONDUCTOR CORP., Hsinchu (TW)

(*) Notice: Subject to any disclaimer, the term of this patent is extended or adjusted under 35 U.S.C. 154(b) by 0 days.

(21) Appl. No.: 16/791,009

(22) Filed: Feb. 14, 2020

(51) Int. Cl.
| H03K 3/03 | (2006.01) |
|---|---|
| H03K 3/011 | (2006.01) |
| H03K 19/0948 | (2006.01) |
| H03K 3/26 | (2006.01) |

(52) U.S. Cl.
CPC ........... *H03K 3/0315* (2013.01); *H03K 3/011* (2013.01); *H03K 3/26* (2013.01); *H03K 19/0948* (2013.01)

(58) Field of Classification Search
USPC .......................................................... 331/57
See application file for complete search history.

(56) References Cited

U.S. PATENT DOCUMENTS

| 9,252,753 | B2 | 2/2016 | Lin | |
|---|---|---|---|---|
| 2009/0096542 | A1* | 4/2009 | Jan | H03K 3/0315 331/175 |
| 2015/0008970 | A1* | 1/2015 | Kang | H03K 3/0315 327/291 |
| 2016/0006420 | A1* | 1/2016 | Lin | H03B 27/00 331/57 |
| 2016/0079981 | A1* | 3/2016 | Lin | H03K 19/0948 327/210 |

* cited by examiner

*Primary Examiner* — Joseph Chang
(74) *Attorney, Agent, or Firm* — McClure, Qualey & Rodack, LLP

(57) ABSTRACT

A circuit includes multiple stages cascaded in a ring topology such that each stage has a preceding stage, a succeeding stage, an alternate-preceding stage, and an alternate-succeeding stage. Each stage includes a MOS transistor of a first type, a MOS transistor of a second type and a resistor. The MOS transistor of a first type receives a first input that is output from the preceding stage, and outputs a second output to the alternate-preceding stage. The MOS transistor of a second type receives a second input that is output from the alternate-succeeding stage, and outputs a first output to the succeeding stage. The resistor provides coupling and level-shifting between the first output and the second output.

9 Claims, 5 Drawing Sheets

LOW SUPPLY VOLTAGE RING OSCILLATOR AND METHOD THEREOF

BACKGROUND OF THE DISCLOSURE

Field of the Disclosure

The present disclosure generally relates to ring oscillators and more particularly to a ring oscillator for operation with a low supply voltage.

Description of Related Art

Persons of ordinary skill in the art will understand terms used in this disclosure, such as CMOS (complementary metal oxide semiconductor), NMOS (n-channel metal-oxide semiconductor) transistor, PMOS (p-channel metal-oxide semiconductor), and basic concepts for electronic circuits, such as: "voltage," "current," "charge," "inverter," "cascade," "oscillator," "ring oscillator," "oscillation," and "frequency." Those of ordinary skill in the art can recognize a resistor symbol, a ground symbol, a PMOS transistor symbol, and NMOS transistor, and can identify the "source," the "gate," and the "drain" of a PMOS transistor or an NMOS transistor. Those of ordinary skills in the art can read schematics of a circuit comprising resistors, NMOS transistors, and PMOS transistors, and do not need a verbose description about how one transistor connects with another in the schematics. Those of ordinary skills in the art also understand units such as GHz (giga-Hertz), micron (μm), nanometer (nm), and Ohm. Terms and basic concepts like these are apparent from prior art documents, e.g. textbooks such as "Design of Analog CMOS Integrated Circuits" by Behzad Razavi, McGraw-Hill (ISBN 0-07-118839-8), which reflect the understanding of persons skilled in the art, and thus will not be explained in detail here.

As depicted in FIG. 1A, copied from U.S. Pat. No. 9,252,753, Lin discloses a quadrature output ring oscillator 100 that comprises: four primary inverters 110, 120, 130, and 140 configured to receive voltages $V_{225}$, $V_{315}$, $V_{45}$, and $V_{135}$, respectively, and to output voltages $V_0$, $V_{90}$, $V_{180}$, and $V_{270}$, respectively; four feed-forward inverters 150, 160, 170, and 180 configured to receive voltages $V_{180}$, $V_0$, $V_{270}$, and $V_{90}$, respectively, and to output voltages $V_{315}$, $V_{135}$, $V_{45}$, and $V_{225}$, respectively; a first coupling resistors 191 configured to couple voltages $V_0$ to $V_{315}$; a second coupling resistors 192 configured to couple voltages $V_{90}$ to $V_{45}$; a third coupling resistors 193 configured to couple voltages $V_{180}$ to $V_{135}$; and a fourth coupling resistors 194 configured to couple voltages $V_{270}$ to $V_{225}$. The four coupling resistors can effectively prevent contention between a primary inverter and a feed-forward inverter and thus alleviate a loss of circuit speed and a waste of power due to the contention. To function correctly, the four primary inverters 110, 120, 130, and 140 and the four feed-forward inverters 150, 160, 170, and 180 must provide a sufficiently high gain to sustain an oscillation.

A schematic diagram of an inverter 101 that can be instantiated to embody inverters 110, 120, 130, 140, 150, 160, 170, and 180 is depicted in FIG. 1B. Inverter 101 comprises an NMOS transistor MN and a PMOS transistor MP. Throughout this disclosure, "$V_{DD}$" denotes a power supply node. A gain of inverter 120 is highly dependent on a supply voltage at $V_{DD}$: the higher (lower) supply voltage, the higher (lower) gain. The quadrature output ring oscillator 100, therefore, is not amenable to a low-voltage application since the supply voltage at $V_{DD}$ may not be sufficiently high for inverters 110, 120, 130, 140, 150, 160, 170, and 180 to have a sufficiently high gain.

What is desired is a ring oscillator that is amenable to a low supply voltage application.

BRIEF DESCRIPTION OF THIS DISCLOSURE

In an embodiment, a circuit includes a first MOS transistor of a first type, a first resistor, a second MOS transistor of the first type, a second resistor, a third MOS transistor of the first type, a third resistor, a fourth MOS transistor of the first type, a fourth resistor, a first MOS transistor of a second type, a second MOS transistor of the second type, a third MOS transistor of the second type, and a fourth MOS transistor of the fourth type. The first MOS transistor of a first type is configured to receive a first voltage from a first node and output a second voltage to a second node. The first resistor is inserted between the second node and a third node. The second MOS transistor of the first type is configured to receive a third voltage from the third node and to output a fourth voltage to fourth node. The second resistor is inserted between the fourth node and a fifth node. The third MOS transistor of the first type is configured to receive a fifth voltage from the fifth node and to output a sixth voltage to a sixth node. The third resistor is inserted between the sixth node and a seventh node. The fourth MOS transistor of the first type is configured to receive a seventh voltage from the seventh node and to output an eighth voltage to an eighth node. The fourth resistor is inserted between the eighth node and the first node. The first MOS transistor of a second type is configured to receive the sixth voltage from the sixth node and to output the third voltage to the third node. The second MOS transistor of the second type is configured to receive the eighth voltage from the eighth node and to output the fifth voltage to the fifth node. The third MOS transistor of the second type is configured to receive the second voltage from the second node and output the seventh voltage to the seventh node. The fourth MOS transistor of the second type is configured to receive the fourth voltage from the fourth node and to output the first voltage to the first node.

In an embodiment, a circuit includes multiple stages cascaded in a ring topology such that each stage has a preceding stage, a succeeding stage, an alternate-preceding stage, and an alternate-succeeding stage. Each stage includes a MOS transistor of a first type, a MOS transistor of a second type, and a resistor. The MOS transistor of the first type is configured to receive a first input that is output from the preceding stage, and to output a second output to the alternate-preceding stage. The MOS transistor of the second type is configured to receive a second input that is output from the alternate-succeeding stage, and to output a first output to the succeeding stage. The resistor is configured to provide coupling and level-shifting between the first output and the second output.

In an embodiment, a method includes the following steps: incorporating multiple stages, each of which includes a MOS transistor of a first type, a MOS transistor of a second type, and a resistor; cascading the stages in a ring topology so that each stage has a preceding stage, a succeeding stage, an alternate-preceding stage, and an alternate-succeeding stage; using the MOS transistor of the first type to receive a first input that is output from the preceding stage, and to output a second output to the alternate-preceding stage; using the MOS transistor of the second type to receive a second input that is output from the alternate-succeeding stage, and to output a first output to the succeeding stage; and using the resistor to provide coupling and level-shifting between the first output and the second output.

In an embodiment, a method includes the following steps: incorporating a first MOS transistor of a first type to receive a first voltage from a first node and to output a second voltage to a second node; incorporating a first resistor to couple the second node to a third node; incorporating a second MOS transistor of the first type to receive a third voltage from the third node and to output a fourth voltage to a fourth node; incorporating a second resistor to couple the fourth node to a fifth node; incorporating a third MOS transistor of the first type to receive a fifth voltage from the fifth node and to output a sixth voltage to a sixth node; incorporating a third resistor to couple the sixth node to a seventh node; incorporating a fourth MOS transistor of the first type to receive a seventh voltage from the seventh node and to output an eighth voltage to an eighth node; incorporating a fourth resistor to couple the eighth node to the first node; incorporating a first MOS transistor of a second type to receive the sixth voltage and to output the third voltage to the third node; incorporating a second MOS transistor of the second type to receive the eighth voltage and to output the fifth voltage to the fifth node; incorporating a third MOS transistor of the second type to receive the second voltage and to output the seventh voltage to the seventh node; and incorporating a fourth MOS transistor of the second type to receive the fourth voltage and to output the first voltage to the first node.

DETAILED DESCRIPTION OF THIS DISCLOSURE

Figure 1A:
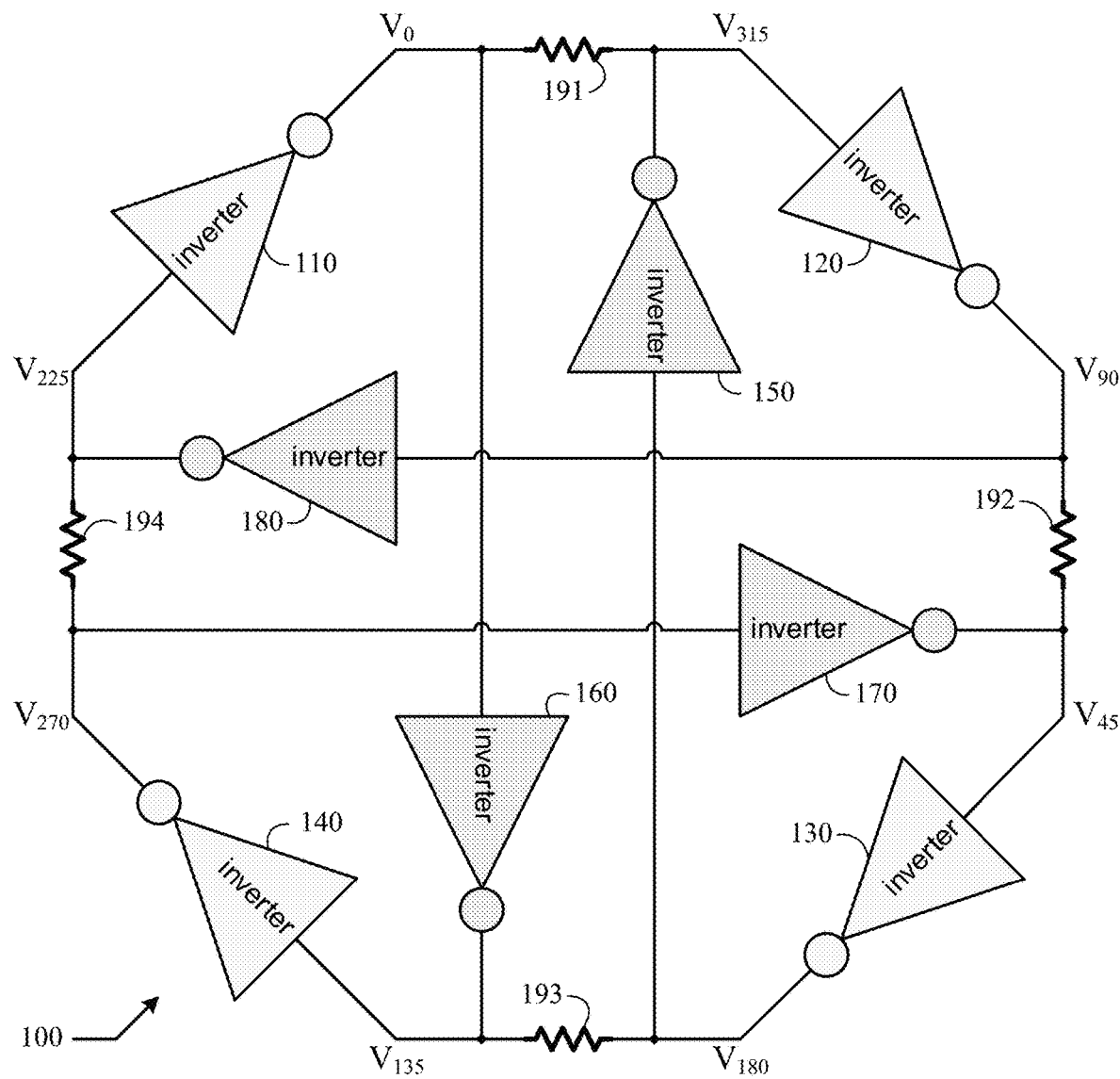
FIG. 1A shows a schematic diagram of a prior art ring oscillator.
Figure 1B:
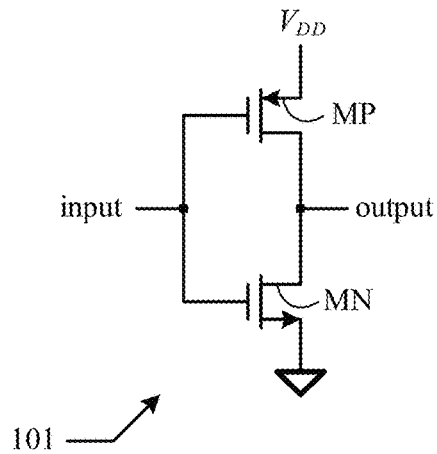
FIG. 1B shows a schematic diagram of an inverter of FIG. 1A.

The present disclosure is directed to ring oscillators. While the specification describes several example embodiments of the disclosure considered favorable modes of practicing the invention, it should be understood that the invention can be implemented in many ways and is not limited to the particular examples described below or to the particular manner in which any features of such examples are implemented. In other instances, well-known details are not shown or described to avoid obscuring aspects of the disclosure.

This present disclosure is disclosed in an engineering sense. For instance, "X is equal to Y" means "a difference between X and Y is smaller than a specified engineering tolerance"; "X is much smaller than Y" means "X divided by Y is smaller than an engineering tolerance"; and "X is zero" means "X is smaller than a specified engineering tolerance."

Throughout this disclosure, "$V_{DD}$" denotes a power supply node. For convenience, "$V_{DD}$" can also refer to a power supply voltage provided at the power supply node. That is, "$V_{DD}$ is 0.9V" means "a power supply voltage at the power supply node $V_{DD}$ is 0.9V."

The present invention is directed to embodiments for overcoming a limitation set by a low supply voltage upon a ring oscillator.

An NMOS transistor is a voltage-to-current conversion device that converts a gate-to-source voltage $V_{gs}$ into a drain current $I_d$ approximately in accordance with the following equation:

$$I_d = \begin{cases} K(V_{gs} - V_{th})^2 & V_{gs} > V_{th} \\ 0 & V_{gs} \leq V_{th} \end{cases} \quad (1)$$

Here, $V_{th}$ is a threshold voltage, and K is a constant. $V_{gs}-V_{th}$ is an overdrive voltage that determines the drain current. In a circuit where a supply voltage is $V_{DD}$, the gate-to-source voltage $V_{gs}$ will be limited to be no higher than $V_{DD}$, and thus the drain current $I_d$ is limited to no higher than $K(V_{DD}-V_{th})^2$. Equation (1) is also applicable to a PMOS transistor, but a polarity of the gate-to-source voltage $V_{gs}$ needs to be reversed (i.e., gate-to-source voltage is replaced by source-to-gate voltage). In a circuit of a low supply voltage, it is difficult for a MOS transistor to output a large drain current due to inherently lacking a high overdrive voltage. In this present disclosure, the absence of a high overdrive voltage to output a large drain current in a low-supply voltage scenario is overcome by extending a duration of the overdrive voltage and thus the drain current. A duty ratio of a MOS transistor is a percentage of time that the MOS transistor is turned on to output a drain current. A total charge output by a MOS transistor is a time-integral of the drain current of said MOS transistor. If the drain current is, for example, reduced by 20% due to a lower supply voltage, but the duration of the drain current, or a duty ratio of the MOS transistor, is extended by 20%, the total charge output by the MOS transistor can remain the same. This way, a reduction in current is compensated by an increase in duty ratio, and the limitation of the low supply voltage can be overcome.

Figure 2:
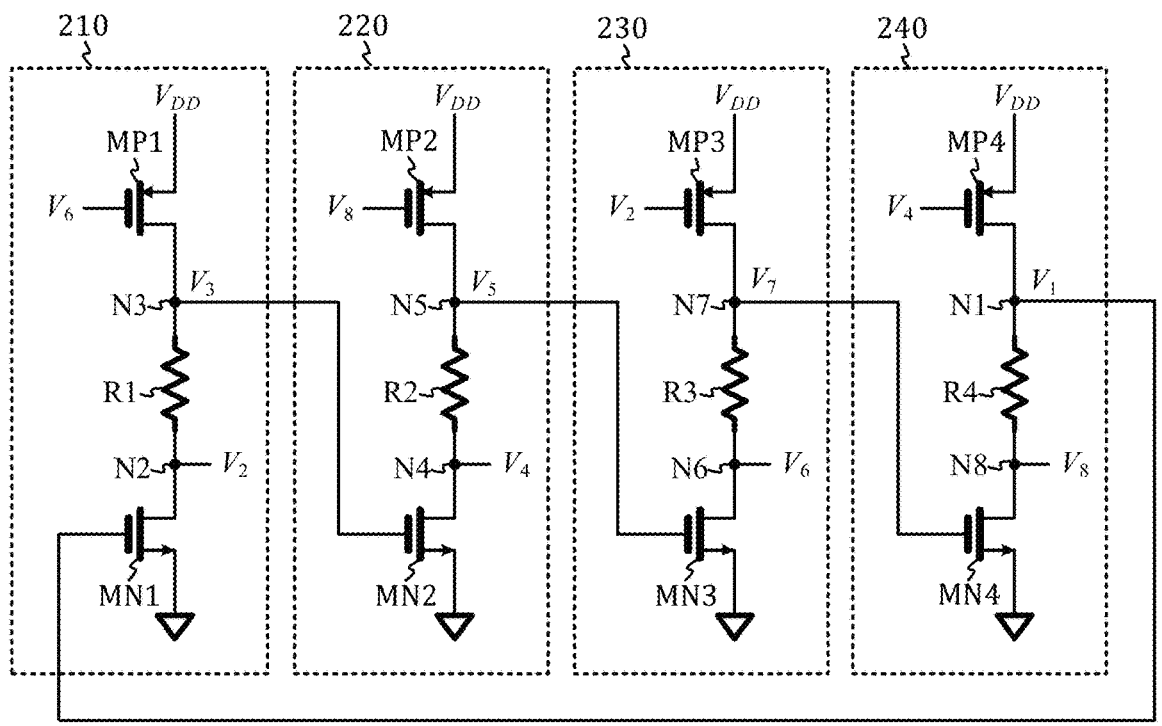
FIG. 2 shows a schematic diagram of a ring oscillator in accordance with an embodiment of the present disclosure.

A schematic diagram of a ring oscillator 200 in accordance with an embodiment of the present disclosure is depicted in FIG. 2. Ring oscillator 200 comprises a first stage 210, a second stage 220, a third stage 230, and a fourth stage 240 cascaded in a ring topology. Due to the ring topology, each stage (of stages 210, 220, 230, and 240) has a preceding stage and a succeeding stage; a preceding stage of the preceding stage is referred to as an "alternate-preceding" stage; and a succeeding stage of the succeeding stage is to as an "alternate-succeeding" stage. More specifically: stage 210 (220, 230, 240) is the preceding stage of stage 220 (230, 240, 210) and the alternate-preceding stage of stage 230 (240, 210, 220); on the other hand, stage 210 (220, 230, 240) is the succeeding stage of stage 240 (210, 220, 230) and the alternate-succeeding stage of stage 230 (240, 210, 220).

Each stage comprises an NMOS transistor, a PMOS transistor, and a resistor. More specifically, stage 210 (220, 230, 240) comprises NMOS transistor MN1 (MN2, MN3, MN4), PMOS transistor MP1 (MP2, MP3, MP4), and resistor R1 (R2, R3, R4). NMOS transistor MN1 (MN2, MN3, MN4) receives a first (third, fifth, seventh) voltage $V_1$ ($V_3$, $V_5$, $V_7$) from a first (third, fifth, seventh) node N1 (N3, N5, N7) and outputs a second (fourth, sixth, eighth) voltage $V_2$ ($V_4$, $V_6$, $V_8$) to a second (fourth, sixth, eighth) node N2 (N4, N6, N8). PMOS transistor MP1 (MP2, MP3, MP4) receives the sixth (eighth, second, fourth) voltage $V_6$ ($V_8$, $V_2$, $V_4$) and outputs the third (fifth, seventh, first) voltage $V_3$ ($V_5$, $V_7$, $V_1$) to the third (fifth, seventh, first) node N3 (N5, N7, N1). Resistor R1 (R2, R3, R4) provides a coupling between the second (fourth, sixth, eighth) node N2 (N4, N6, N8) and the third (fifth, seventh, first) node N3 (N5, N7, N1) and fulfills a level-shifting function.

In summary, each stage receives a first input that is output from the preceding stage and a second input that is output from the alternate-succeeding stage, and outputs a first output to the succeeding stage and a second output to the alternate-preceding stage; the NMOS transistor therein is configured to receive the first input and output the second output; the PMOS transistor therein is configured to receive the second input and output the first output; and the resistor therein is configured to provide a coupling and level-shifting between the first output and the second output. Here, for stage 210 (220, 230, 240): the NMOS transistor therein refers to NMOS transistor MN1 (MN2, MN3, MN4); the PMOS transistor therein refers to PMOS transistor MP1 (MP2, MP3, MP4); the resistor therein refers to resister R1 (R2, R3, R4); the preceding stage is stage 240 (210, 220, 230); the first input refers to $V_1$ ($V_3$, $V_5$, $V_7$); the alternate-succeeding stage is stage 230 (240, 210, 220); the second input refers to $V_6$ ($V_8$, $V_2$, $V_4$); the succeeding stage is stage 220 (230, 240, 210); the first output refers to $V_3$ ($V_5$, $V_7$, $V_1$); the alternate-preceding stage is stage 230 (240, 210, 220); the second output refers to $V_2$ ($V_4$, $V_6$, $V_8$); when the first input rises sufficiently high, the NMOS transistor therein is turned on and pulls down the second output directly and pulls down the first output indirectly via the resistor therein, but the first output remains higher than the second output due to the resistor therein; when the second input falls sufficiently low, the PMOS transistor therein is turned on and pulls up the first output directly and pulls up the second output indirectly via the resistor therein, but the first output remains higher than the second output due to the resistor therein. This way, the first output remains higher than the second output, and a level-shifting function is thus fulfilled.

Due to the level-shifting of resistor R1 (R2, R3, R4), NMOS transistor MN2 (MN3, MN4, MN1) can have a high duty ratio since $V_3$ ($V_5$, $V_7$, $V_1$) can stay high to allow draining current from node N4 (N6, N8, N2) for a long duration. A total charge drained from node N4 (N6, N8, N2) can be high, and therefore a pull-down of $V_4$ ($V_6$, $V_8$, $V_2$) by NMOS transistor MN2 (MN3, MN4, MN1) can be strong even when the supply voltage $V_{DD}$ is low. Likewise, PMOS transistor MP3 (MP4, MP1, MP2) can have a high duty ratio due to that $V_2$ ($V_4$, $V_6$, $V_8$) can stay low to allow injecting current to node N7 (N1, N3, N5) for a long duration. A total charge injected to node N7 (N1, N3, N5) can be high, and a pull-up of $V_7$ ($V_1$, $V_3$, $V_5$) by PMOS transistor MP3 (MP4, MP1, MP2) can be strong even when the supply voltage $V_{DD}$ is low. Ring oscillator 200, therefore, can overcome a limitation of a low supply voltage by extending a duty ratio of a MOS transistor thanks to the level-shifting function.

An oscillation cycle of ring oscillator 200 is described as follows. Consider a low-to-high transition event of $V_1$; it prompts NMOS transistor MN1 to pull down $V_2$ to ground; this prompts PMOS transistor MP3 to pull up $V_7$ to $V_{DD}$; this prompts NMOS transistor MN4 to pull down $V_8$ to ground and also pulls down $V_1$ to ground via resistor R4, resulting in a high-to-low transition event of $V_1$; this prompts PMOS transistor MP2 to pull up $V_5$ to $V_{DD}$; this prompts NMOS transistor MN3 to pull down $V_6$ to ground; and this prompts PMOS transistor MP1 to pull up $V_3$ to $V_{DD}$; this prompts MNOS transistor MN2 to pull down $V_4$ to ground; this prompts PMOS transistor MP4 to pull up $V_1$ to $V_{DD}$, resulting in a next low-to-high transition event of $V_1$. This way, a low-to-high transition event takes place in a cyclic, recurring manner, and an oscillation is thus established.

Note that resistor R1 (R2, R3, R4) can also avoid a direct contention between NMOS transistor MN1 (MN2, MN3, MN4) and PMOS transistor MP1 (MP2, MP3, MP4), and therefore the same merit of the prior art ring oscillator taught by Lin in U.S. Pat. No. 9,252,753 is preserved.

Note that, in a circuit comprising a plurality of PMOS transistors and a plurality of NMOS transistors, the function of the circuit remains the same if every PMOS transistor is replaced by an NMOS transistor, every NMOS transistor is replaced by a PMOS transistor, every power supply node is replaced by a ground node, and every ground node is replaced by a power supply node. This way, the circuit is said to be "flipped," wherein the roles of PMOS transistor and NMOS transistor are swapped and the roles of power supply and ground are also swapped, but the function remains the same. Therefore, ring oscillator 200 can be "flipped" and becomes an alternative embodiment, which does not need to be explicitly shown, such an implementation would be obvious to persons of ordinary skill in the art.

Ring oscillator 200 is a four-stage ring oscillator, but the teaching of the present disclosure can be applied to any number of stages that is higher than two, e.g. three-stage, four-stage, five-stage, six-stage, seven-stage, and so on.

In ring oscillator 200, for each stage, the alternate-preceding stage happens to be the same as the alternate-succeeding stage. However, this is a coincidence and a special case that only occurs in a four-stage scenario. In general, the alternate-preceding stage is different from the alternate-succeeding stage, except for the special case of a four-stage scenario.

Figure 3A:
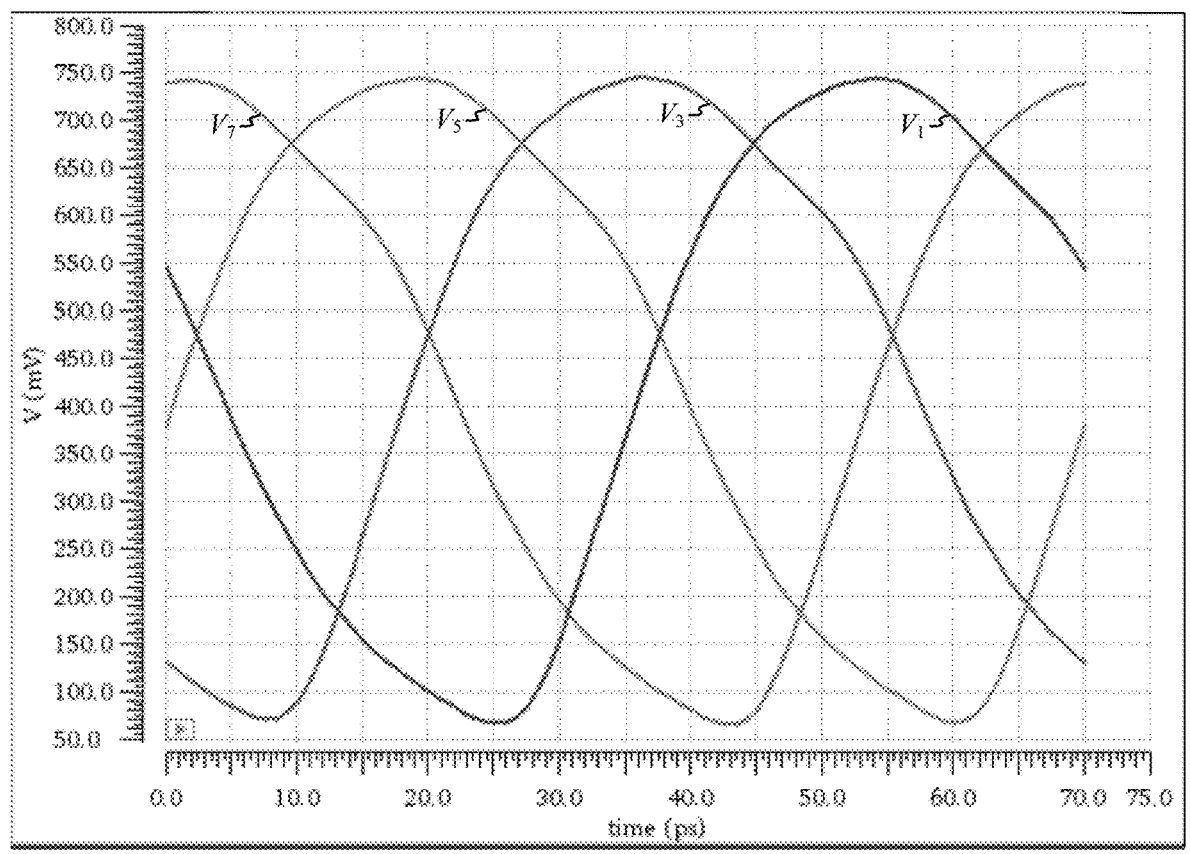
FIG. 3A shows a waveform of a simulation of the ring oscillator of FIG. 2.
Figure 3B:
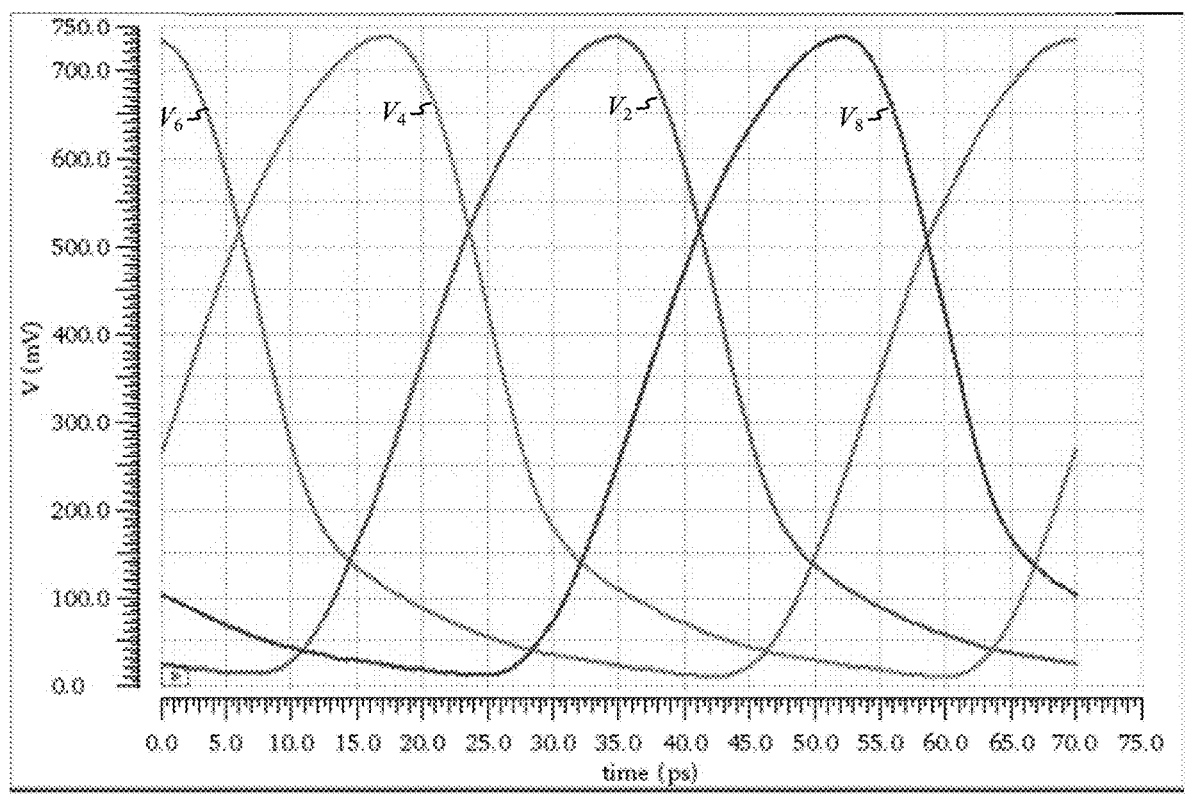
FIG. 3B shows an additional waveform of the simulation of the ring oscillator of FIG. 2.

By way of example but not limitation, in an embodiment, ring oscillator 200 is fabricated using a 28 nm CMOS (complementary metal oxide semiconductor) process; width and length of NMOS transistors MN1, MN2, MN3, and MN4 are 32 μm and 45 nm, respectively; width and length of PMOS transistors MP1, MP2, MP3, and MP4 are 16 μm and 30 nm, respectively; resistors R1, R2, R3, R4 are 75 Ohm; and $V_{DD}$ is 0.77V. A simulation result is shown in FIGS. 3A and 3B. Here, an oscillation frequency is approximately 14.25 GHz and a period is approximately 70.18 ps. As shown in FIG. 3A, $V_7$, $V_5$, $V_3$, and $V_1$ are of the same waveform but uniformly displaced in time to form a four-phase clock. As shown in FIG. 3B, $V_6$, $V_4$, $V_2$, and $V_8$ are of the same waveform but uniformly displaced in time to form a four-phase clock. It is clear that $V_7$, $V_5$, $V_3$, and $V_1$ stay high longer than low, resulting in a high duty ratio to allow the NMOS transistors they control to output more charge. On the other hand, $V_6$, $V_4$, $V_2$, and $V_8$ stay low longer than high, resulting in a high duty ratio to allow the PMOS transistors they control to output more charge.

Figure 4:
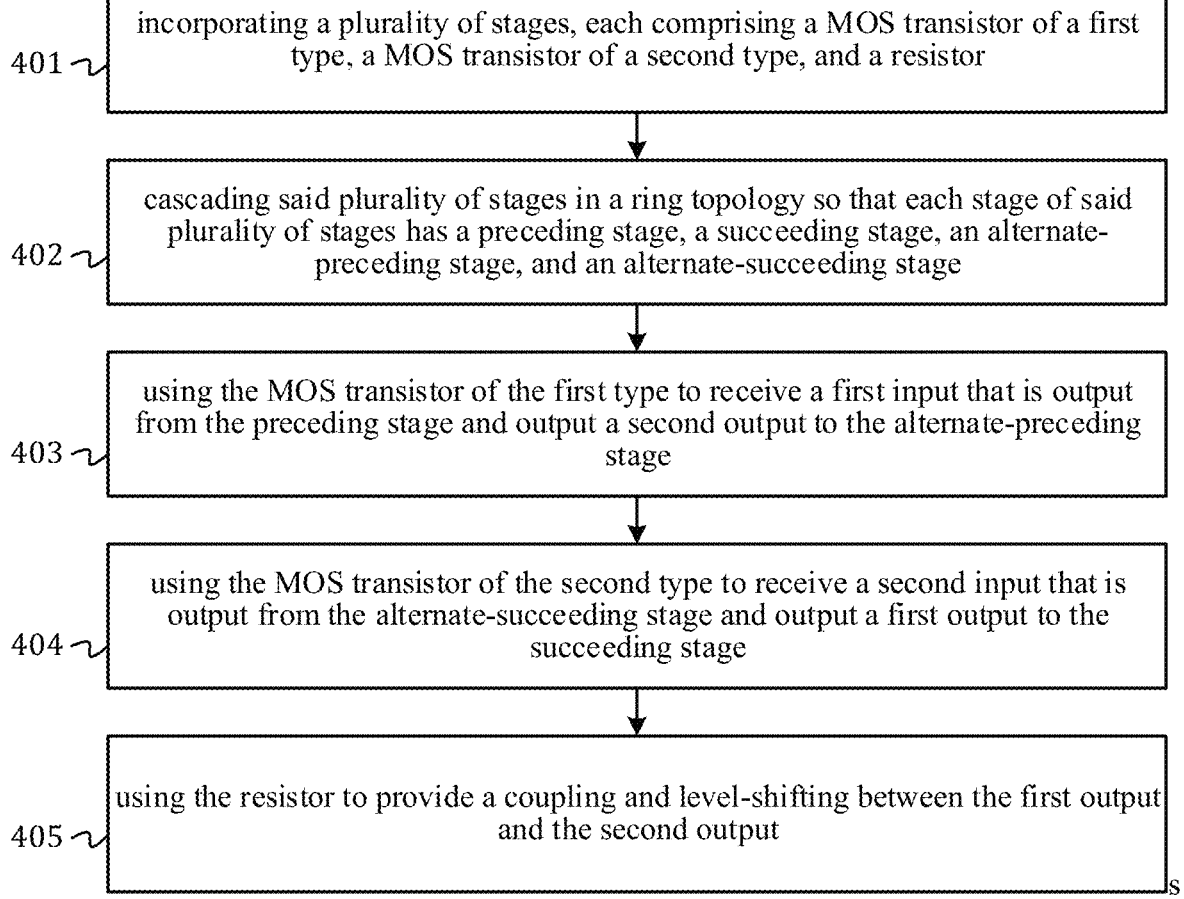
FIG. 4 shows a flow diagram of a method in accordance with an embodiment of the present disclosure.

As illustrated by the flow diagram shown in FIG. 4, a method in accordance with an embodiment of the present disclosure comprises: (step 401) incorporating a plurality of stages, each comprising a MOS transistor of a first type, a MOS transistor of a second type, and a resistor; (step 402) cascading said plurality of stages in a ring topology so that each stage of said plurality of stages has a preceding stage, a succeeding stage, an alternate-preceding stage, and an alternate-succeeding stage; (step 403) using the MOS transistor of the first type to receive a first input that is output from the preceding stage and output a second output to the alternate-preceding stage; (step 404) using the MOS transistor of the second type to receive a second input that is output from the alternate-succeeding stage and output a first output to the succeeding stage; and (step 405) using the resistor to provide a coupling and level-shifting between the first output and the second output.

Those skilled in the art will readily observe that numerous modifications and alterations of the device and method may be made while retaining the teachings of the disclosure. Accordingly, the above disclosure should not be construed as limited only by the metes and bounds of the appended claims.

What is claimed is:

1. A circuit comprising:
   a first MOS (metal oxide semiconductor) transistor of a first type configured to receive a first voltage from a first node and output a second voltage to a second node;
   a first resistor inserted between the second node and a third node;
   a second MOS transistor of the first type configured to receive a third voltage from the third node and output a fourth voltage to fourth node;
   a second resistor inserted between the fourth node and a fifth node;
   a third MOS transistor of the first type configured to receive a fifth voltage from the fifth node and output a sixth voltage to a sixth node;
   a third resistor inserted between the sixth node and a seventh node;
   a fourth MOS transistor of the first type configured to receive a seventh voltage from the seventh node and output an eighth voltage to an eighth node;
   a fourth resistor inserted between the eighth node and the first node;
   a first MOS transistor of a second type configured to receive the sixth voltage from the sixth node and output the third voltage to the third node;
   a second MOS transistor of the second type configured to receive the eighth voltage from the eighth node and output the fifth voltage to the fifth node;
   a third MOS transistor of the second type configured to receive the second voltage from the second node and output the seventh voltage to the seventh node; and
   a fourth MOS transistor of the second type configured to receive the fourth voltage from the fourth node and output the first voltage to the first node.

2. The circuit of claim 1, wherein every MOS transistor of the first type is an NMOS (n-channel metal oxide semiconductor) transistor, and every MOS transistor of the second type is a PMOS (p-channel metal oxide semiconductor) transistor.

3. The circuit of claim 1, wherein every MOS transistor of the first type is a PMOS (p-channel metal oxide semiconductor) transistor, and every MOS transistor of the second type is an NMOS (n-channel metal oxide semiconductor) transistor.

4. A circuit comprising a plurality of stages cascaded in a ring topology such that each stage has a preceding stage, a succeeding stage, an alternate-preceding stage, and an alternate-succeeding stage, wherein each stage comprises:
   a MOS (metal oxide semiconductor) transistor of a first type configured to receives a first input that is output from the preceding stage and output a second output to the alternate-preceding stage;
   a MOS transistor of a second type configured to receive a second input that is output from the alternate-succeeding stage and outputs a first output to the succeeding stage; and
   a resistor configured to provide coupling and level-shifting between the first output and the second output.

5. The circuit of claim 4, wherein the MOS transistor of the first type is an NMOS (n-channel metal oxide semiconductor) transistor, and the MOS transistor of the second type is a PMOS (p-channel metal oxide semiconductor) transistor.

6. The circuit of claim 5, wherein the MOS transistor of the first type is a PMOS (p-channel metal oxide semiconductor) transistor, and the MOS transistor of the second type is an NMOS (n-channel metal oxide semiconductor) transistor.

7. A method comprising:
   incorporating a plurality of stages, each comprising a MOS (metal oxide semiconductor) transistor of a first type, a MOS transistor of a second type, and a resistor;
   cascading said plurality of stages in a ring topology so that each stage of said plurality of stages has a preceding stage, a succeeding stage, an alternate-preceding stage, and an alternate-succeeding stage;
   using the MOS transistor of the first type to receive a first input that is output from the preceding stage and output a second output to the alternate-preceding stage;
   using the MOS transistor of the second type to receive a second input that is output from the alternate-succeeding stage and output a first output to the succeeding stage; and
   using the resistor to provide coupling and level-shifting between the first output and the second output.

8. The method of claim 7, wherein the MOS transistor of the first type is an NMOS (n-channel metal oxide semiconductor) transistor, and the MOS transistor of the second type is a PMOS (p-channel metal oxide semiconductor) transistor.

9. The method of claim 7, wherein the MOS transistor of the first type is a PMOS (p-channel metal oxide semiconductor) transistor, and the MOS transistor of the second type is an NMOS (n-channel metal oxide semiconductor) transistor.

* * * * *